United States Patent [19]

Lyke

[11] 4,041,377
[45] Aug. 9, 1977

[54] MAGNETOSTRICTION TESTING APPARATUS HAVING DIGITAL OUTPUT DISPLAY

[75] Inventor: Richard F. Lyke, Middletown, Ohio

[73] Assignee: Armco Steel Corporation, Middletown, Ohio

[21] Appl. No.: 717,631

[22] Filed: Aug. 25, 1976

[51] Int. Cl.² ........................................... G01R 33/12
[52] U.S. Cl. ................................................ 324/34 MA
[58] Field of Search ................ 324/34 R, 34 MA, 73, 324/DIG. 2

[56] References Cited

U.S. PATENT DOCUMENTS

| | | | |
|---|---|---|---|
| 2,312,888 | 3/1943 | Everest | 324/34 MA |
| 2,596,752 | 5/1952 | Williams | 324/34 MA |
| 2,850,697 | 9/1958 | Little, Jr. | 324/34 MA |

Primary Examiner—Robert J. Corcoran
Attorney, Agent, or Firm—Melville, Strasser, Foster & Hoffman

[57] ABSTRACT

A method and apparatus for providing a digital display representing the magnetostrictive characteristics of a test specimen is disclosed. The apparatus is useful in combination with a test fixture of the type having means for inducing a periodic and alternating induction in a test specimen and including at least one displacement sensitive transducer mounted in association with the test specimen for generating a magnetostriction signal reflecting the magnetostrictive deformation of the test specimen in response to the induction. The apparatus includes a timing circuit associated with the means for inducing the induction in the test specimen, the timing circuit being adapted for producing a series of timing signals identifying the occurrences of zero and maximum induction in the specimen. A conversion circuit operates under the control of the timing circuit for deriving from the magnetostriction signal a DC difference signal which is proportional to the difference between the amplitudes of the magnetostriction signal corresponding to the occurrences of maximum and zero induction in the test specimen. The DC difference signal, which reflects the magnetostrictive characteristics of the test specimen, is applied to a display which produces a digital output corresponding to the magnitude and polarity of the DC difference signal.

9 Claims, 5 Drawing Figures

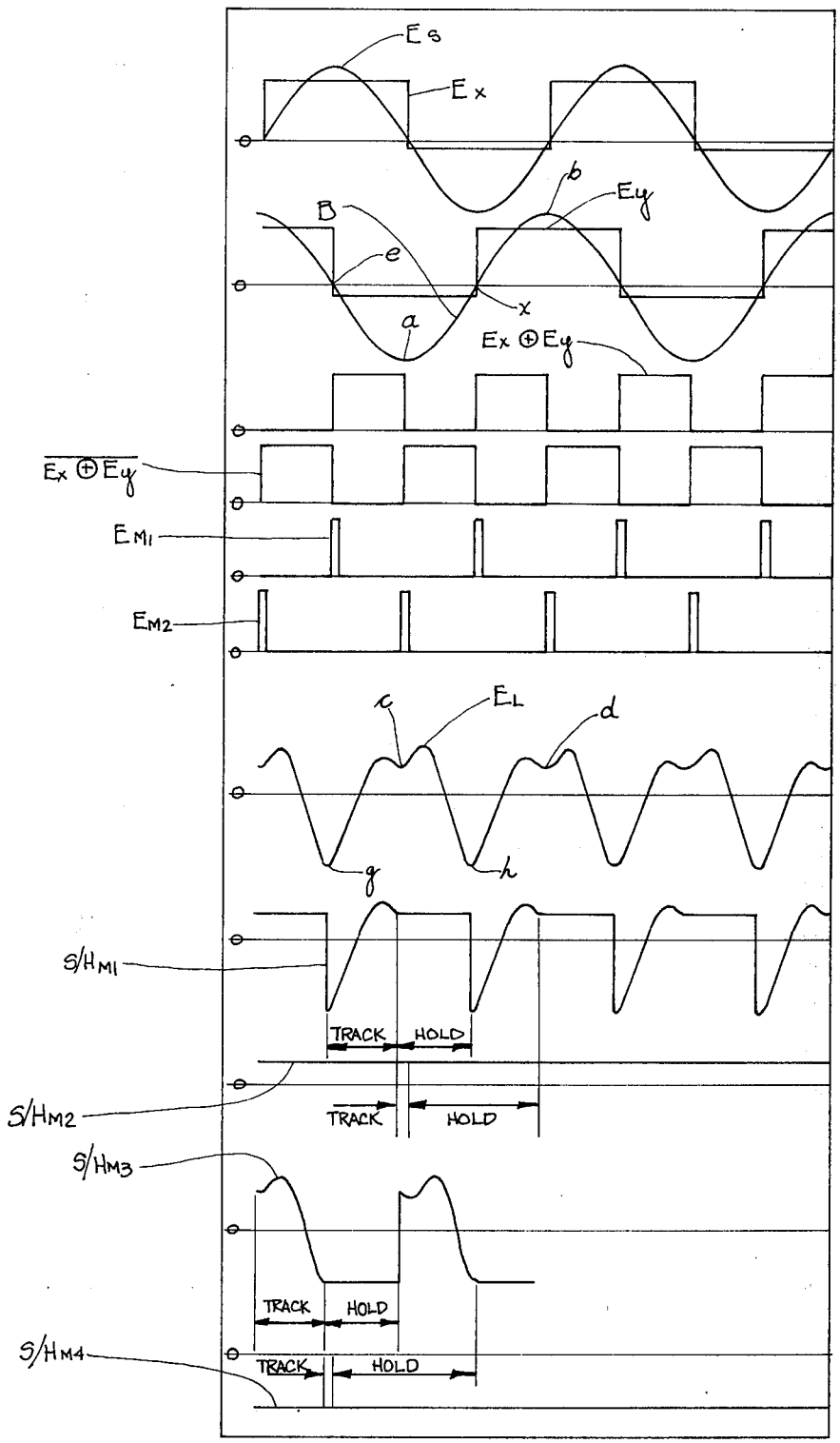

MAGNETOSTRICTION TESTING APPARATUS HAVING DIGITAL OUTPUT DISPLAY

BACKGROUND OF THE INVENTION

The apparatus and method of the present invention relates generally to the field of magnetostrictive testing. More particularly, the present invention concerns means for determining the magnetostrictive characteristics of a test specimen and, specifically, such means wherein the magnetostrictive characteristics are displayed through the agency of a digital output device.

Magnetostriction, the phenomenon of elastic deformation that accompanies magnetization, is a characteristic of ferromagnetic materials frequently monitored in association with the production of various types of steel products. Although quality control is the primary objective for magnetostriction testing, a secondary objective is to relate the magnetostrictive characteristics of the material being tested with its potential sound-producing properties. For quality control, the stress level of a material and the "goodness" of the material's coating are related to the magnitude and polarity of its magnetostrictive characteristics. Therefore, it is highly desirable to sample the magnetostrictive characteristics of a production run of steel for quality control purposes. In addition, knowledge of the magnetostrictive characteristics of a material would be useful in applications such as the fabrication of transformer cores where the vibration of the material, under the influence of changing magnetic fields, contributes significantly to the sound-producing properties of the transformer.

For these and various other reasons numerous devices have been developed to provide a facility whereby the magnetostrictive characteristics of materials may be measured. In this regard, prior art devices generally utilize one or more of three basic techniques in order to measure the magnetostriction of a test specimen. The three basic techniques, all of which are concerned with measuring the change in length of a test specimen subjected to a magnetic field, include the use of arrangements of mechanical levers, the use of optical apparatus and the use of electrical systems. For example, U.S. Pat. No. 2,312,888 discloses a magnetostriction measuring apparatus utilizing both mechanical levers and an optical system to sense changes of length in a test specimen subjected to a magnetic field. U.S. Pat. No. 2,596,752 discloses another magnetostriction measuring apparatus utilizing optical methods.

Apparently, the most prevalent prior art technique for performing magnetostrictive testing involves the use of electrical or electronic circuits. In prior art devices of this type, an oscilloscope or the like is frequently used as the output device for providing a display reflecting the magnetostrictive properties of a test sample which is magnetized to a particular induction, commonly of the sinusoidal variety. The oscilloscope display may take the form of a Lissajous figure wherein induction is displayed on the oscilloscope horizontal axis and the resulting specimen length variations on its vertical axis. The value of magnetostriction is then read as the vertical distance measured between the points on the display where the induction is zero and a maximum value. The latter method of reading the magnetostriction signal is commonly referred to as the "crossover to tip" method. Although other methods for reading the magnetostriction signal are known, the "crossover to tip" method has been generally preferred.

Disadvantages associated with known prior art magnetostriction testing apparatus and methods result, at least partially, from the use of analogue output display devices such as oscilloscopes. The necessity of interpreting oscilloscope displays generally requires that training programs be established for instructing equipment operators in the use of the test apparatus as well as in the reading of the displays. However, even with such training programs, reading errors are not uncommon and precise measurements are quite difficult to achieve. In addition, prior art magnetostriction testing apparatus is normally susceptible to low frequency ambient vibrations at the test location which further reduces the precision of the resulting display.

Many of the foregoing disadvantages are alleviated through the use of magnetostriction testing apparatus having digital means as the agency for displaying the value of magnetostriction. Although some attempts have been made in this direction, they have not proven to be altogether satisfactory and are not adapted for implementing the "crossover to tip" method of reading magnetostriction. See, for example, U.S. Pat. Nos. 3,807,223 and 3,838,595.

SUMMARY OF THE INVENTION

It is in general an object of the present invention to provide a method and apparatus whereby magnetostrictive characteristics of a test specimen may be precisely measured and conveniently displayed to an equipment operator. It is a further object of the present invention to provide a magnetostriction testing capability of the foregoing type which is substantially insensitive to low frequency ambient vibration.

More particularly, it is an object of the present invention to provide a magnetostriction testing system which includes means for digitally displaying the value of the magnetostriction of a test specimen as determined by the "crossover to tip" method.

In accordance with the foregoing and other useful objects the magnetostriction testing system of the present invention is useful in combination with a test fixture of the type having means for inducing an alternating and periodic induction in a test specimen and further including at least one displacement sensitive transducer mounted in association with the test specimen for generating a magnetostriction signal reflecting the magnetostrictive deformation of the test specimen in response to the induction.

The invention comprises the use of a timing circuit connected in association with the means for inducing the induction in the test specimen. Responsive to the changes in induction, the timing circuit generates a series of timing signals which have logical transitions at the occurrences of maximum and zero induction in the specimen being tested.

A conversion circuit, operable under the control of the timing circuit, includes a first data channel connected for receiving the magnetostriction signal from the test fixture and includes means for developing a first DC output signal proportional to the amplitude of the magnetostriction signal corresponding to the occurrences of maximum induction in the test specimen. The conversion circuit further includes a second data channel also connected for receiving the magnetostriction signal and including means for developing a second DC output signal proportional to the amplitude of the magnetostriction signal corresponding to the occurrences of zero induction in the test specimen.

The first and second DC output signals are applied to a difference amplifier, the output of which is a DC signal proportional to the difference between the length of the test specimen at maximum induction and its length at zero induction. Finally, the output of the difference amplifier is applied to a digital voltmeter or the like which provides a digital display reflecting both the magnitude and polarity of the difference signal, thus indicating the "crossover to tip" magnetostriction of the test sample.

BRIEF DESCRIPTION OF THE DRAWINGS

FIG. 5 is a graphical depiction of various pertinent waveforms throughout the circuitry of the present invention.

DESCRIPTION OF THE PREFERRED EMBODIMENTS

Figure 1:
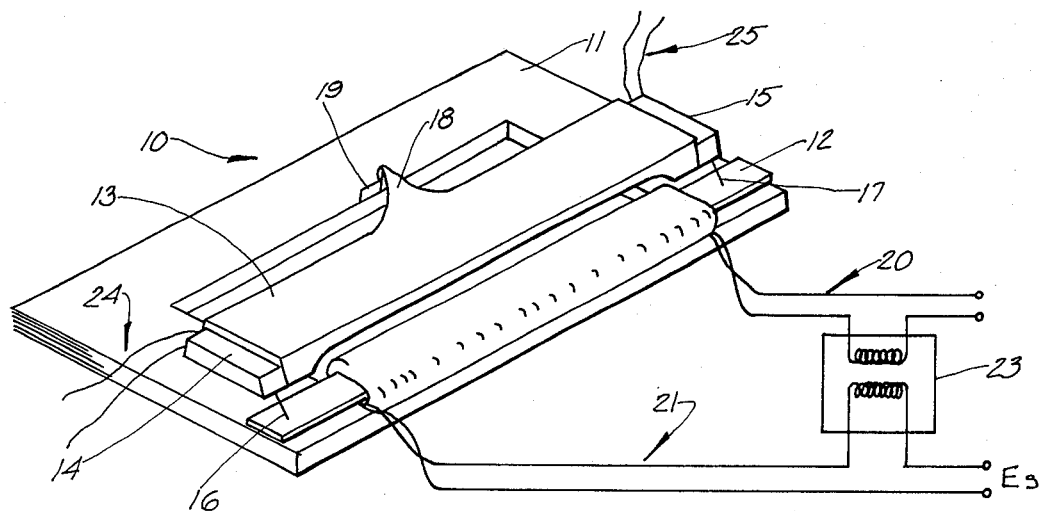
FIG. 1 shows, in perspective, a typical prior art test fixture useful with the magnetostriction testing apparatus of the present invention.

Referring now to the drawings, and particularly to FIG. 1, there is illustrated a conventional test fixture, indicated generally at 10, useful in association with the magnetostriction testing system of the present invention. The test fixture 10 comprises a high-permeability laminated yoke 11 for supporting a test specimen 12, the yoke 11 having a relatively large cross sectional area compared to that of the test specimen 12. A lightweight non-magnetic coupling member 13 carries a pair of displacement sensitive transducers 14 and 15 at its distal ends and is supported above the yoke 11 by means of transducer needles 16 and 17 which rest upon test specimen 12 and by lip portion 18 which communicates with rest post 19. Typically, means are included for enabling the coupling member 13 to be reproducibly raised and lowered relative to the test specimen 12.

In the preferred embodiment of the present invention, the test specimen 12 is magnetized to an essentially sinusoidal induction B, see FIG. 5, by energizing primary winding 20 with a 60 Hz sinusoidal signal. The voltage $E_s$ induced in the secondary winding 21 will therefore also comprise a 60 Hz sine wave but will lag the induction B waveform by 90°. For purposes to be described in more detail hereinafter, the secondary voltage $E_s$ is applied to the input of the timing circuit 22. Also, a conventional air flux compensator 23 may be provided intermediate windings 20 and 21 to cancel the effect of the flux that would be produced were the test specimen not present.

It will be appreciated that the changing induction B and the sinusoidal flux induced in the test specimen 12 by the primary winding 20 will, in accordance with the principles of magnetostriction, cause test specimen 12 to periodically expand and contract. The differentially connected transducers 14 and 15 detect the corresponding motion of test specimen 12 between needles 16 and 17 and generate signals on output lines 24 and 25 reflecting the instantaneous deformation of the sample in response to the changing induction. The signals produced on lines 24 and 25, which typically are shielded coaxial cables, will hereinafter be referred to as the magnetostriction signal and comprises, assuming the application of a 60 Hz signal to primary winding 20, a distorted, full-wave rectified sine wave having a fundamental frequency of 120 Hz. An inverted and amplified representation of the magnetostriction signal $E_L$ is shown in FIG. 5 for a sample of oriented steel subjected to an induction of approximately 17 kilogausses. While not to be taken as limiting, it has been found that piezoelectric displacement transducers such as model B-2 phonograph cartridges manufactured by Astatic provide quite acceptable performance in connection with test fixture 10. It will be further appreciated that the differential connection of transducers 14 and 15 relative to the test specimen 12 will tend to minimize the presence of noise in the magnetostriction signal due to common motion of specimen 12 resulting from, for example, ambient room vibrations. Also, it is generally recognized that the "crossover to tip" method of reading magnetostriction, which is utilized in the apparatus of the present invention, is inherently insensitive to electrical noise at 60 Hz and the odd harmonics thereof, which additionally tends to reduce the effects of distortion in the magnetostriction signal.

Figure 2:
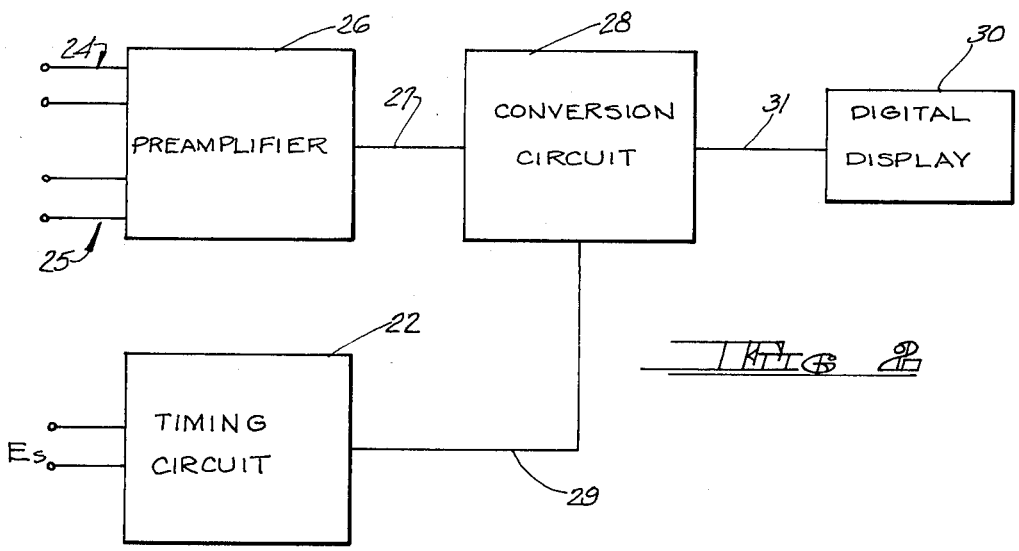
FIG. 2 is a functional block diagram showing the relationship between the basic components of the present invention.

As shown in FIG. 2, the magnetostriction signal is applied via lines 24 and 25 from transducers 14 and 15 to the input of preamplifier 26. The output of preamplifier 26 is connected by line 27 to the input of a conversion circuit 28 which is also connected to the timing circuit 22 by line 29. Finally, the output of the conversion circuit 28 is connected to a digital display 30 by line 31.

In terms of function, the preamplifier 26 sums the signals on output lines 24 and 25 such that the output on line 27 is proportional to the differential motion between the transducers 14 and 15 which therefore represents the joule magnetostriction of the specimen being tested. The timing circuit 22, which is connected to the secondary winding 21, develops from the secondary voltage $E_s$ a series of timing signals which have logical transitions at the occurrences of maximum and zero induction in the specimen being tested. The conversion circuit 28, under control of the timing signals from the timing circuit 22, samples the amplitude of the amplified magnetostriction signal on line 27 at each occurrence of maximum induction and forms a first DC signal proportional thereto. The conversion circuit 28 also samples the amplitude of the magnetostriction signal on line 27 at each occurrence of zero induction and forms a second DC signal proportional thereto. These first and second DC signals are then fed to a difference amplifier which develops a DC signal on line 31 proportional to the difference between the length of the specimen at maximum induction and its length at zero induction. Finally, the output of the conversion circuit 28 appearing on line 31 is applied to a digital display 30 to obtain a digital indication of the "crossover to tip" magnetostriction of the test specimen.

Figure 3:
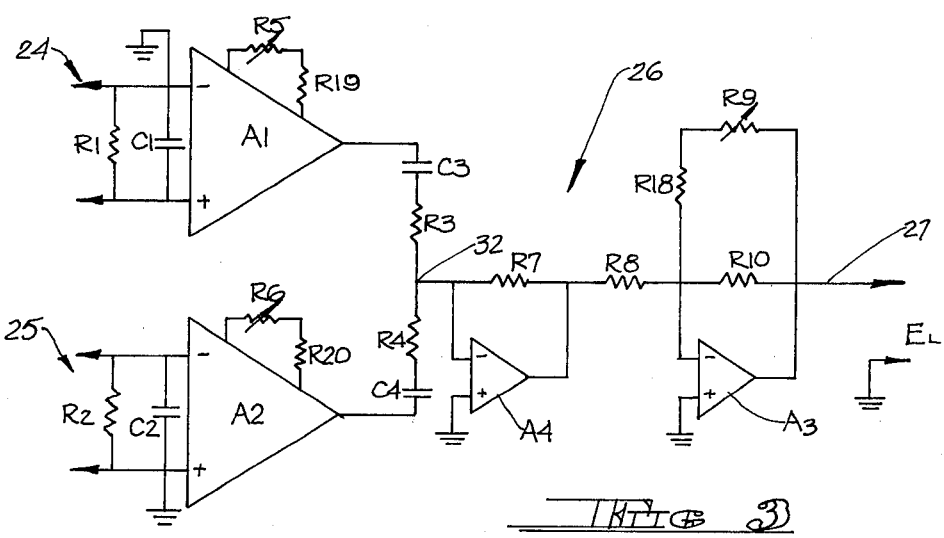
FIG. 3 is a schematic electrical diagram showing one embodiment of the preamplifier shown generally in FIG. 2.

The preamplifier 26, whose primary functions include the scaling, matching and calibration of the magnetostriction signal from transducers 14 and 15, is shown in more detail in FIG. 3. It will therein be observed that the magnetostriction signal from transducers 14 and 15 is applied to input instrumentation amplifiers A1 and A2 through parallel RC networks R1, C1 and R2, C2. In order to maintain the differential operation of transducers 14 and 15, the inverting input of instrumentation amplifier A1 is grounded while the non-inverting input of instrumentation amplifier A2 is grounded. In addition, the input impedances of the instrumentation amplifiers A1 and A2 are sufficiently high, typically $10^{13}$ Ohms, so that the input impedance of each channel is essentially that of its associated parallel RC network. The RC networks, R1, C1 and R2, C2, interact with the piezoelectric crystals of the transducers to form a high pass current filter which reduces the effect of low frequency noise from ambient vibration. Further attenuation of low frequency noise is accomplished by the series RC networks R3, C3 and R4, C4 connected to the outputs of the instrumentation amplifiers A1 and A2 which form high-pass voltage filters.

While, ideally, the outputs on lines 24 and 25 from transducers 14 and 15 are equal, in practice slight mismatches in the transducers may cause one output to slightly differ from the other. This mismatch may be conveniently compensated for by appropriately adjusting potentiometers R5 and R6 which independently control the gain of instrumentation amplifiers A1 and A2. As a result, a summated and properly amplified and filtered representation of the magnetostriction signal generated by transducers 14 and 15 is developed at node 32.

Node 32 of the preamplifier 26 is connected to a final stage of amplification comprising operational amplifier A3 through coupling resistor R8 and an optional buffer stage including operational amplifier A4 and feedback resistor R7. The gain of the final amplification stage is controlled by the setting of feedback potentiometer R9 which facilitates appropriate scaling of the magnetostriction signal. Also, feedback resistor R10 is provided to protect the operational amplifier A3 from saturation. The output $E_L$ of the preamplifier 26 is taken from the output of operational amplifier A3 and applied to the conversion circuit 28 over line 27. Since the preamplifier 26 includes three inversion stages, its output $E_L$ is an inverted and amplified summation of the magnetostriction signals from the transducers 14 and 15 and therefore represents the changes in length of the test specimen in response to the applied induction. That is, referring to FIG. 5, the amplitude of the magnetostriction curve $E_L$ corresponding to any particular value of induction on the induction curve B represents the change in length of the test specimen at the occurrence of that particular value of induction. For example, at the points of maximum induction $a$ and $b$, the change in length of the test specimen is represented by the amplitude of the magnetostriction curve $E_L$ at points $c$ and $d$. Similarly, at the occurrences of zero induction $e$ and $f$, the change in length of the test specimen is represented by the amplitudes of the magnetostriction curve $E_L$ at points $g$ and $h$. Remembering that the magnetostriction curve $E_L$ is actually inverted with respect to the output of transducers 14 and 15, it will be seen that the test specimen 12 generally contracts due to increasing induction between points $g$ and $c$ and generally expands under the influence of decreasing induction between points $c$ and $h$.

Figure 4:
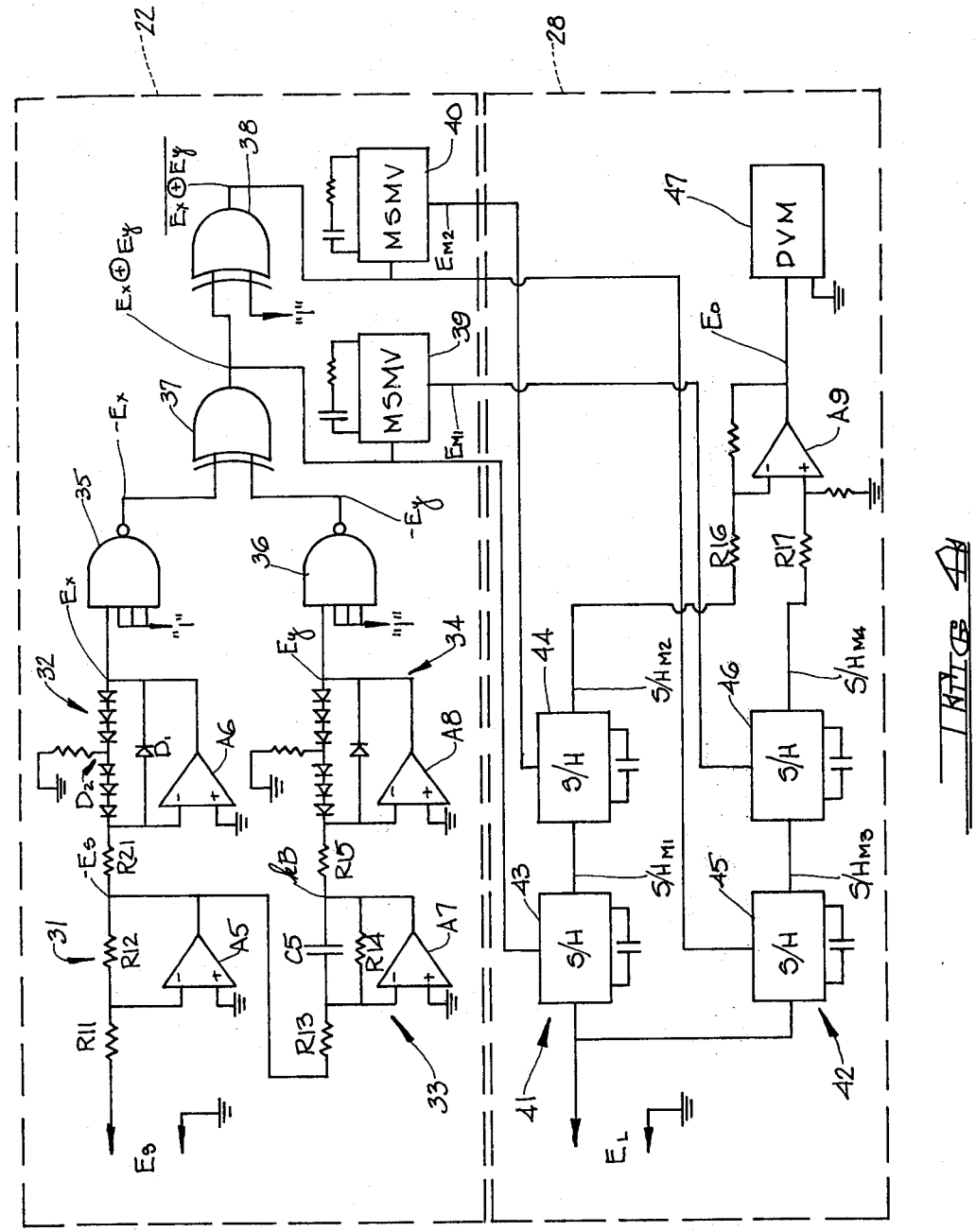
FIG. 4 is a schematic electrical diagram showing one embodiment of the timing circuit and conversion circuit shown generally in FIG. 2.

With reference now to FIG. 4, the secondary voltage $E_s$ from the secondary winding 21 is applied to the input of the timing circuit 22 whereas the inverted and filtered magnetostriction signal $E_L$ from the preamplifier 26 is applied to the input of the conversion circuit 28. In the timing circuit 22, the secondary voltage $E_s$ is initially applied through coupling resistor R11 to an isolation stage 31 which isolates the secondary winding 21 of test fixture 10 from the succeeding low impedance circuits. The isolation stage 31, which comprises operational amplifier A5 and feedback resistor R12, introduces unity gain and inverts the secondary voltage $E_s$. The inverted secondary voltage $-E_s$ is applied from the isolation stage 31 through coupling resistor R21 to a conventional wave shaping network 32 and through coupling resistor R13 to a conventional integrating network 33.

Wave shaping network 32, which comprises operational amplifier A6, diode D1 and the string of six series connected diodes D2, generates a non-symmetrical square wave $E_x$ having transitions at those points where the secondary voltage $E_s$ is equal to zero. It will be appreciated that assuming each of the diodes D1, D2 has a forward voltage drop of 0.7 volts, when the secondary voltage $E_s$ is positive, the diodes D2 will be forward biased, diode D1 being reversed biased, causing $E_x$ to assume a positive value of approximately 4.2 volts. Conversely, when the secondary voltage $E_s$ is negative, diode D1 will be forward biased, diodes D2 being reversed biased, causing $E_x$ to assume a negative value of approximately 0.7 volts. Furthermore, it will be observed that since the secondary voltage $E_s$ is proportional to the derivative with respect to time of the induction B, the transitions of $E_x$ occur at the absolute maximum values of induction B.

The integrating network 33, which comprises operational amplifier A7, and the feedback RC network R14, C5, inverts and introduces a phase shift of 90° to its input $-E_s$ thereby generating an output $kB$ proportional to and in phase with the induction B. the output $kB$ of the integrating network 33 is then applied through resistor R15 to wave shaping network 34 which is identical in design and operation to wave shaping network 32. The output $E_y$ of wave shaping network 34 is therefore a non-symmetrical square wave similar to $E_x$ but having transitions at the points where the induction B equals zero.

To provide further wave shaping, the outputs $E_x$ and $E_y$ of the wave shaping networks 32 and 34 are each applied to one input of Schmitt-Trigger Nand gates 35 and 36. Since the remaining inputs of the Nand gates 35 and 36 are supplied with a logical one level signal, the effect is to invert the inputs $E_x$ and $E_y$ and produce output signals $-E_x$ and $-E_y$ which are compatible with the succeeding logic circuits. The output $-E_x$ and $-E_y$ of Nand gates 35 and 36 are next applied an EXCLUSIVE OR gate 37 which generates the output signal $E_x \oplus E_y$ as shown in FIG. 5. EXCLUSIVE OR gate 38 is connected to invert its one input and therefore generates the output $\overline{E_x \oplus E_y}$. Finally, the output of EXCLUSIVE OR gates 37 and 38 are used to respectively trigger a pair of monostable multivibrators 39 and 40 which produce outputs $E_{m1}$ and $E_{m2}$ each comprising trains of relatively short duration logic pulses.

With further reference to FIG. 4, the conversion circuit 28 comprises a pair of data channels 41 and 42, each having inputs connected to receive the inverted magnetostriction signal $E_L$ from the preamplifier 26. Data channel 41, the $B_{max}$ channel, comprises a pair of series connected sample and hold amplifiers 43 and 44 controlled respectively, by the $E_x \oplus E_y$ and $E_{m2}$ output signals from the EXCLUSIVE OR gate 37 and the monostable multivibrator 40. Similarly, data channel 42, the $B_O$ channel, comprises a pair of series connected sample and hold amplifiers 45 and 46 controlled, respectively, by the $\overline{E_x \oplus E_y}$ and $E_{m1}$ output signals from the EXCLUSIVE OR gate 38 and the monostable multivibrator 39. Each of the sample and hold amplifiers 43-46 is adapted to track or sample its input when its respective controlling signal is at a logically high level and to hold the last sampled value when its controlling signal is at a logically low level.

With additional reference to the wave forms shown in FIG. 5, it will be observed that, during each half cycle of the induction waveform B, the output $S/H_1$ of the sample and hold amplifier 43 of the $B_{max}$ channel 41 tracks the magnetostriction signal $E_L$ as the absolute value of the induction B increases from zero to a maximum value. For the remaining portion of the induction half cycle, i.e. until the next succeeding zero value of induction, the output $S/H_{m1}$ is held at the amplitude of the magnetostriction signal $E_L$ corresponding to the occurrence of maximum induction. The second sample and hold amplifier 44 of the $B_{max}$ channel 41 tracks the output $S/H_{m1}$ of sample and hold amplifier 43 for a brief interval, defined by the pulse width of the $E_{m2}$ pulses, following the instant that sample and hold amplifier 43 begins "holding" and otherwise holds its last tracked value. After the tracking interval of sample and hold amplifier 44 is completed, sample and hold amplifier 43 can return to tracking the magnetostriction signal $E_L$ without influencing the output $S/H_{m2}$ of sample and hold amplifier 44 until the next cycle. It will be appreciated that the output $S/H_{m2}$ of sample and hold amplifier 44 therefore comprises a DC signal proportional to the amplitude of the inverted magnetostriction signal $E_L$ at the occurrences of maximum induction B.

In a similar manner, the output $S/H_{m4}$ of sample and hold amplifier 46 develops from the output $S/H_{m3}$ of sample and hold amplifier 45 a second DC signal. In this case, however, the DC signal $S/H_{m4}$ is proportional to the amplitude of the inverted magnetostriction signal $E_L$ occurring at the points of zero induction.

The DC signals $S/H_{m2}$ and $S/H_{m4}$ are then applied through coupling resistors R16 and R17 to, respectively, the inverting and non-inverting inputs of difference amplifier A9 wherein the output of the $B_{max}$ channel 41 is subtracted from the output of the $B_O$ channel 42 to produce an output signal $E_O$ reflecting the "crossover to tip" magnetostriction of the test sample 12. The DC output signal $E_O$ is finally applied to a digital voltmeter which digitally displays the magnitude and polarity of the measured value of magnetostriction. The polarity of the measured magnetostriction value will, of course, be determined by the direction of the difference between $E_L$ at the occurrences of maximum and zero induction.

For purposes of example only, there is provided below a tabulation identifying various components and component values which may be utilized with the apparatus of the present invention.

TABLE

Instrumentational Amplifiers $A_1$ $A_2$—Teledyne Philbrick Model 4253.
Operational Amplifiers A3— A9—Teledyne Philbrick Model 1028.
All Logic Circuits—Texas Instruments SN—series.
Sample and Hold Amplifiers 43—46— Burr-Brown Model SHC 23.
All diodes—IN4148
Digital Voltmeter 47—United Systems Model 277—2.
Potentiometers R5, R6—100K ohms.
Potentiometer R9—10K ohms.
Resistors R1, R2—4.7M ohms.
Resistors R8, R18, R13, R15, R19, R20—5K ohms.
Resistors R10, R16, R17—50K ohms.
Resistors R3, R4, R7, R11, R12—100K ohms.
Resistor R14—500K ohms.
Capacitors C1, C2—470 picofarads.
Capacitors C3, C4, C5—0.5 microfarads.

The present invention may be embodied in other specific forms without departing from the spirit or essential attributes thereof and, accordingly, reference should be made to the appended claims, rather than to the foregoing specification as indicating the scope of the invention.

The embodiments of the invention in which an exclusive property or privilege is claimed are defined as follows:

1. In a magnetostriction testing apparatus of the type having means for inducing an alternating and periodic induction in a test specimen and having at least one displacement sensitive transducer mounted in association with said test specimen for generating a magnetostriction signal representative of the magnetostrictive deformation of said test specimen in response to said induction, the improvement comprising:
   a. a timing circuit in association with said means for inducing said induction for developing a plurality of timing signals, some at least of said timing signals having logical transitions corresponding to the occurrences of zero and maximum induction in said test specimen;
   b. a conversion circuit responsive to said timing signals for generating from said magnetostriction signal a DC difference signal proportional to the difference between the amplitudes of said magnetostriction signal corresponding to the occurrences of maximum and zero induction in said test specimen, and
   c. means responsive to said conversion circuit for producing a display reflecting the magnitude and polarity of said DC difference signal.

2. The improvement according to claim 1 wherein said means responsive to said conversion circuit comprises means for producing a digital display.

3. The improvement according to claim 2 including means connected intermediate said transducer and said conversion circuit for amplifying said magnetostriction signal and including means for filtering the low frequency noise therefrom.

4. The improvement according to claim 3 wherein said conversion circuit comprises:
   a. a first data channel connected for receiving said amplified magnetostriction signal and including means for developing a first DC output signal proportional to the amplitude of said magnetostriction signal corresponding to the occurrences of maximum induction in said test specimen;
   b. a second data channel connected for receiving said amplified magnetostriction signal and including means for developing a second DC output signal proportional to the amplitude of said magnetostriction signal corresponding to the occurrences of zero induction in said test specimen; and
   c. a differential amplifier connected for generating an output comprising said second DC output signal subtracted from said first DC output signal, said output of said differential amplifier comprising said DC difference signal.

5. The improvement according to claim 4 wherein said means for amplifying includes means for inverting said magnetostriction signal and wherein said timing circuit comprises means for generating a first timing signal characterized by a first logical condition between all occurrences of zero induction and their respective immediately succeeding occurrences of maximum induction in said test specimen and otherwise characterized by a second logical condition, said timing circuit further including means for generating a second timing signal comprising the complement of said first timing signal and means for generating third and fourth timing signals comprising, respectively, trains of relatively short duration logic pulses at said first logical condition and occurring substantially immediately succeeding each transition from said first to second logical condition of said first and second timing signals.

6. The improvement according to claim 5 wherein said first and second data channels each comprise an input sample and hold amplifier responsive to, respectively, said first and second timing signals and each having an input connected for receiving said amplified and inverted magnetostriction signal, said first and second data channels each further comprising an output sample and hold amplifier responsive to, respectively, said third and fourth timing signals and each having an input connected for receiving the output of its respective input sample and hold amplifier, each of said sample and hold amplifiers being operative for causing its output to track its input only so long as its associated timing signal is characterized by said first logical condition and to otherwise hold its output at the last tracked value of its input, whereby the outputs of said output sample and hold amplifiers of said first and second data channels comprise, respectively, said first and second DC output signals.

7. The method of generating a digital display representing the magnetostrictive characteristics of a test specimen comprising the steps of:
   a. inducing a periodic and alternating induction in said test specimen;
   b. generating a magnetostriction signal representative of the magnetostrictive deformation of said test specimen in response to said induction;
   c. simultaneously developing first and second output signals reflecting, respectively, the amplitudes of said magnetostriction signal at the occurrences of maximum and zero induction in said test specimen;
   d. subtracting said second output signal from said first output signal to provide a difference signal; and
   e. digitally displaying the polarity and magnitude of said difference signal.

8. The method according to claim 7 wherein said step of developing said first and second output signals comprises the steps of:
   a. developing an intermediate signal by tracking said magnetostriction signal between each occurrence of zero induction in said test specimen and the immediately succeeding occurrence of maximum induction in said test specimen and holding the last tracked value thereof until the next occurrence of zero induction in said test specimen; and
   b. developing said first signal by tracking, for a relative short time period following each occurrence of maximum induction in said test specimen, said intermediate signal and holding the last tracked value thereof until the next occurrence of maximum induction in said test specimen.

9. The method according to claim 7 wherein said step of developing said first and second output signals comprises the steps of:
   a. developing an intermediate signal by tracking said magnetostriction signal between each occurrence of maximum induction in said test specimen and the immediately succeeding occurrence of zero induction in said test specimen and holding the last tracked value thereof until the next occurrence of maximum induction in said test specimen; and
   b. developing said second output signal by tracking, for a relatively short time period following each occurrence of zero induction in said test specimen, said intermediate signal and holding the last tracked value thereof until the next occurrence of zero induction in said test specimen.

* * * * *